United States Patent
Steffan et al.

Patent Number: 6,154,711
Date of Patent: *Nov. 28, 2000

[54] DISPOSITION TOOL FOR FACTORY PROCESS CONTROL

[75] Inventors: Paul J. Steffan, Elk Grove; Ming Chun Chen, Milpitas, both of Calif.

[73] Assignee: Advanced Micro Devices, Inc., Sunnyvale, Calif.

[ * ] Notice: This patent is subject to a terminal disclaimer.

[21] Appl. No.: 08/985,467

[22] Filed: Dec. 5, 1997

[51] Int. Cl.⁷ .................................................. H01L 21/66

[52] U.S. Cl. ............................... 702/82; 702/81; 702/84; 702/181; 700/109; 700/121; 438/14

[58] Field of Search ................................. 702/81–84, 181, 702/33–35, 57, 58, 64, 65, 117–123, 155–157, 159, 166, 170–172, 179, 182–185, FOR 103–FOR 106, FOR 123–FOR 125, FOR 137, FOR 139, FOR 147–FOR 149, FOR 145, FOR 170, FOR 171; 703/13, 14; 700/108–110, 119–121, 303; 382/145, 149; 438/10, 11, 14–18

[56] References Cited

U.S. PATENT DOCUMENTS

| | | | |
|---|---|---|---|
| 5,511,005 | 4/1996 | Abbe et al. | 702/84 |
| 5,646,870 | 7/1997 | Krivokapic et al. | 703/13 |
| 5,719,796 | 2/1998 | Chen | 702/181 |
| 5,822,218 | 10/1998 | Moosa et al. | 700/121 |
| 5,866,437 | 2/1999 | Chen et al. | 438/14 |

*Primary Examiner*—Hal Wachsman
*Attorney, Agent, or Firm*—H. Donald Nelson

[57] ABSTRACT

A method of manufacturing semiconductor wafers using a simulation tool to determine a set of predicted wafer electrical test parameters. The set of predicted wafer electrical test parameters are compared with wafer electrical test specifications tabulated for each process during the manufacturing process. During the comparison, it is determined whether the predicted wafer electrical test parameters are within the specifications for the process and circuit simulations are then conducted using the predicted wafer electrical test parameters. Device performance is predicted from the circuit simulations and the disposition of the wafer lot is determined utilizing tabulated from a disposition performance table.

2 Claims, 5 Drawing Sheets

DISPOSITION TOOL FOR FACTORY PROCESS CONTROL

CROSS REFERENCE TO THE RELATED APPLICATIONS

This application is related to Application, Serial No. 08/985,470, issued as U.S. Pat. No. 6,041,270, filed on the filing date of this application, entitled AUTOMATIC RECIPE ADJUST AND DOWNLOAD BASED ON PROCESS CONTROL WINDOW and to the Application, Serial No. 08/985,556, issued as U.S. Pat. No. 5,866,437, filed on the filing date of this application, entitled DYNAMIC PROCESS WINDOW CONTROL USING SIMULATED WET DATA FROM CURRENT AND PREVIOUS LAYER DATA both of which are assigned to the assignee of this application.

BACKGROUND OF THE INVENTION

1. Field of the Invention

This invention relates generally to the manufacture of high performance integrated circuits on semiconductor devices. More specifically, this invention relates to optimizing the manufacture of high performance integrated circuits on semiconductor devices using simulated wafer electrical test data (WET) from current and previous layer data. Even more specifically, this invention relates to accurate disposition of wafer lots in the manufacture of semiconductor device based on remaining available specification margins in future processes and current processing results.

2. Discussion of the Related Art

In the typical semiconductor manufacturing facility, many simulation and analysis tools have been implemented to assist the process integration and device development efforts. These simulation and analysis tools, however, are typically employed to provide an indication of general trends. The latent potential of reducing the number of silicon runs and speeding up the process optimization cycle has not been fully achieved. One of the primary reasons the process optimization cycle has not been achieved is that the accuracy of the data obtained cannot be established to the degree necessary to determine the dependability of the simulation systems. The accuracy of the data obtained can only be achieved by a complete and detailed engineering calibration of the simulation system. This calibration, however, demands extensive engineering resources and data from multiple silicon production runs which, in turn, is usually only available at the latter stages of the process development or early production cycles.

In addition, process optimization for a technology that has completed qualification and is ramping-up production could receive great benefit from the extensive embedded device physics contained in advanced complex simulation tools.

Current trends in semiconductor process development include the use of these simulation tools to predict certain wafer electrical tests (WET) device performance characteristics based on a predetermined set of process values. The use of these simulation tools has been very effective. Additionally, optimal performance of current large-scale integrated devices can be predicted by a subset of critical WET performance parameters. These performance criteria include speed, operating temperature, power utilization, and reliability.

Furthermore, current manufacturing technology utilizes in-line statistical evaluation of critical parametric values at most module steps in the overall process flow. These statistical values are used to maintain control of the process, at the particular process module in question, often without regard to previous processing results. Often the goal of manufacturing is to meet not only yield goals, but certain performance goals as well. Currently, to do this it is necessary to force certain values to meet very strict specifications, such as shifting polysilicon gate critical dimensions (CD) or increasing or increasing threshold adjust implant, and hope that other process module variations will not adversely affect performance.

Further trends in semiconductor processing are continually moving towards more automated or system level control of individual equipment components to maintain a high degree or confidence in the overall process environment. The standard practice has been to require strict adherence to a rigidly controlled specification limit for certain process parameters such that natural variation within those specifications at various critical steps would not permit device performance to vary outside of the desired operating range. The current practice is to continually adjust toward the middle of the specification, making recipe modifications as necessary to implement the fine-tuning, and these adjustments are based on the current trend of the equipment. These specifications stand alone at the individual process steps and are generally not affected by the previous processing results of the lot.

A process simulation tool has been disclosed in the Application Serial No. 08/985,566, issued as U.S. Pat. No. 5,866,437, entitled DYNAMIC PROCESS WINDOW CONTROL USING SIMULATED WET DATA FROM CURRENT AND PREVIOUS LAYER DATA that uses a method to achieve optimum performance by providing a process control window or specification for the current module by utilizing the previous process step statistical data as a baseline that is entered into the process simulation tool. Such a process control window has the potential of being much wider than current specifications due to the previous layer parameters and their effects being precisely known and can be considered dynamic since the process control window can change based on actual previous layer data. The simulation tool would be preset to optimize the process to hit certain critical WET parametrics. Using the previous data baseline, and the WET goals, the simulator tool would then provide direction by providing a process control window for the remaining operations to achieve those goals.

A method of automatically making adjustments to the process recipes for the remaining operations has been disclosed in the Application, Serial No. 08/985,470, issued as U.S. Pat. No. 6,041,270, entitled AUTOMATIC RECIPE ADJUST AND DOWNLOAD BASED ON PROCESS CONTROL WINDOW that uses a simulation tool to determine a set of predicted wafer electrical test measurements that are compared to a set of target wafer electrical test measurements to obtain a set of optimized process parameters for the equipment for the next process. The optimized process parameters are compared to the equipment characteristics for the equipment of the next process and the process parameters for the next process are automatically adjusted.

The above improvements to the manufacturing process provide methods of adjusting a current or future process to compensate for a previous process that was not within the pre-established specifications. However, with some processes that may be out of specification and other processes that have been adjusted to compensate for the processes that are out of specification, there is currently no way for a process engineer to make disposition recommendations based on out-of-specification values at a current operation or module, while taking into account the effects of previous steps and the effect the current values will have on later steps or device performance.

Therefore, what is needed is a method to predict expected device performance based on remaining available specification margins at future processes or modules and current processing results.

SUMMARY OF THE INVENTION

A disposition tool for factory process control in accordance with the present invention solves the above and other problems associated with the present semiconductor manufacturing process.

The above and other objects and advantages of the present invention are attained by a system that compares predicted wafer electrical parameters with wafer electrical test specifications for the present layer. If the predicted wafer electrical test parameters are within the wafer electrical test specifications, a circuit simulation is conducted using the predicted wafer electrical test parameters to obtain predicted device performance data. From the predicted device performance data a disposition determination is made from a table of disposition performance criteria.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention that illustrates the best mode presently contemplated by the inventors for practicing the invention.

Figure 1:
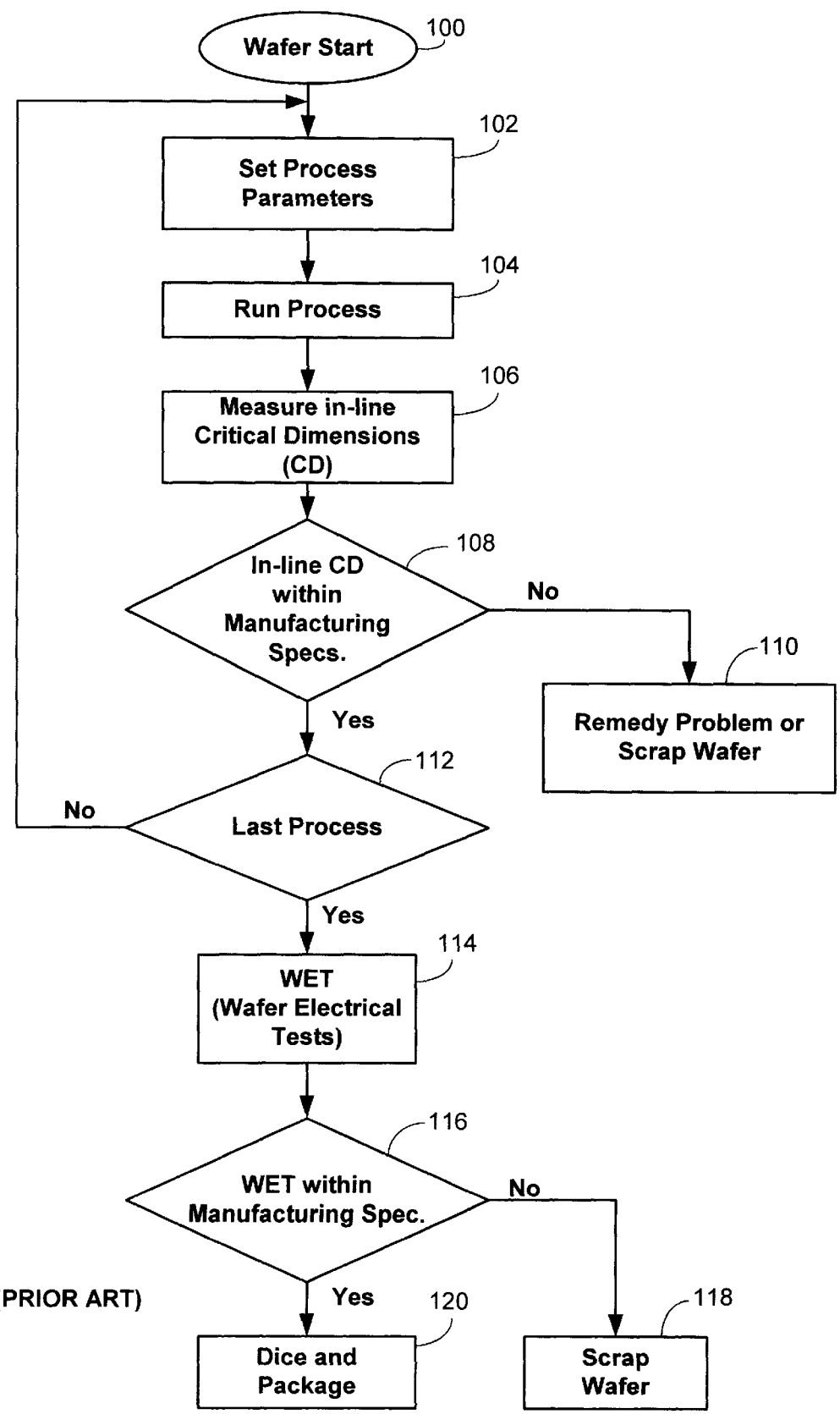
FIG. 1 shows a prior art manufacturing process.

FIG. 1 shows a prior art manufacturing process for the manufacture of semiconductor devices. A wafer lot is started as indicated at 100. The process parameters are set in the process equipment as indicated at 102. The current process is run as indicated at 104. After the current process is completed, the in-line critical dimensions (CD) are measured at 106. At 108, it is determined if the in-line critical dimensions are within pre-established manufacturing specifications. If the in-line critical dimensions are not within the manufacturing specifications, it is attempted to find a remedy as shown at 110, and if a remedy is not available, the wafers are scrapped. If, at 108, it is determined that the in-line critical dimensions are within the manufacturing specifications, it is then determined at 112 if the process just completed is the last process. If it is not the last process, the wafer lot is sent to the next process at 102 where the process parameters for the next process are set in the process equipment. If the process just completed is the last process, the wafer electrical tests (WET) are conducted as indicated at 114. If, at 116, it is determined that the WET measurements are not within the WET manufacturing specifications the wafer lot is scrapped as indicated at 118. If the WET measurements are within the WET manufacturing specifications the wafer lot is sent to the next stage of the manufacturing process, which could be the dice and packaging stage as shown at 120.

Figure 2:
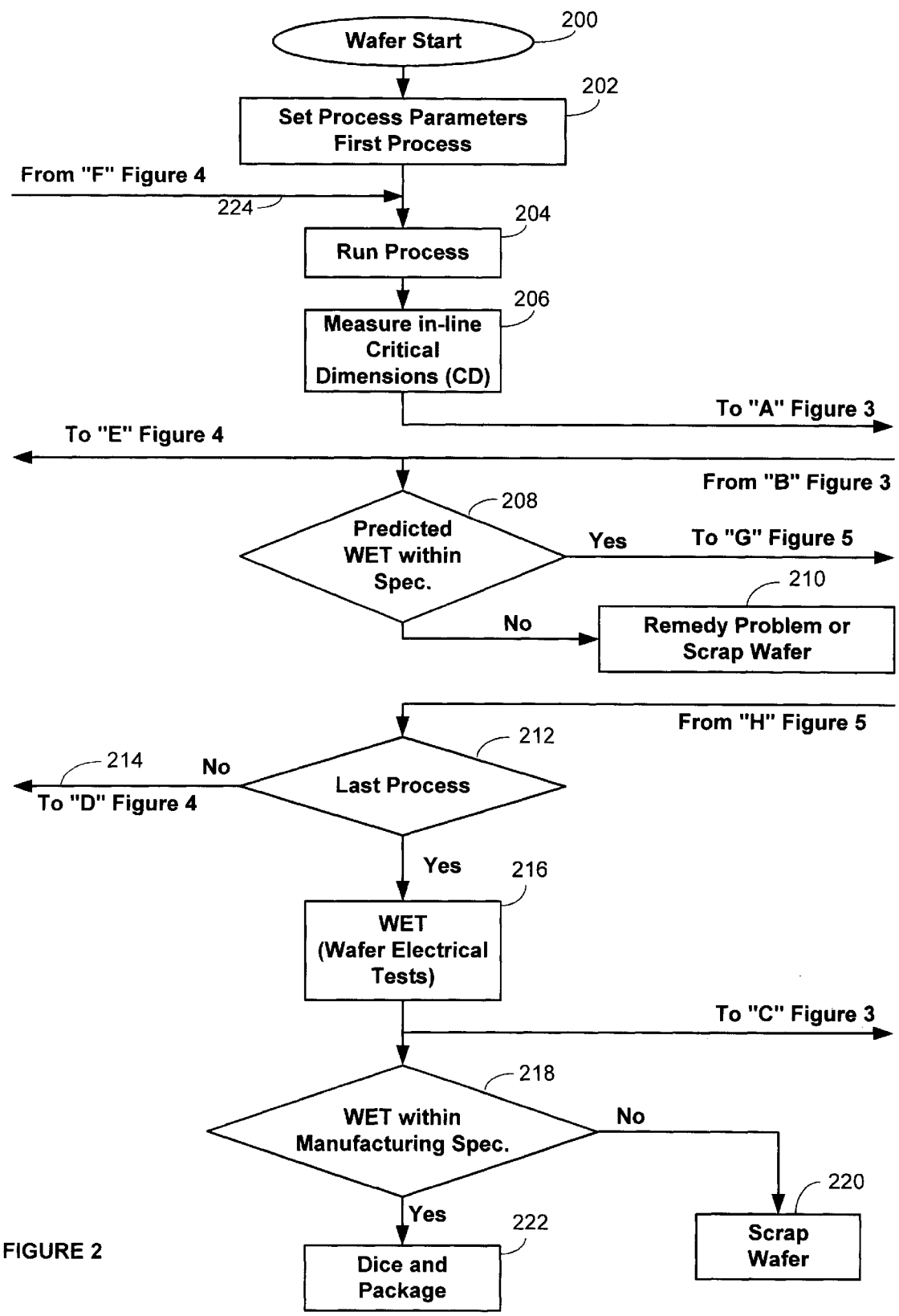
FIGS. 2–5 show a manufacturing process in accordance with the present invention.
Figure 3:
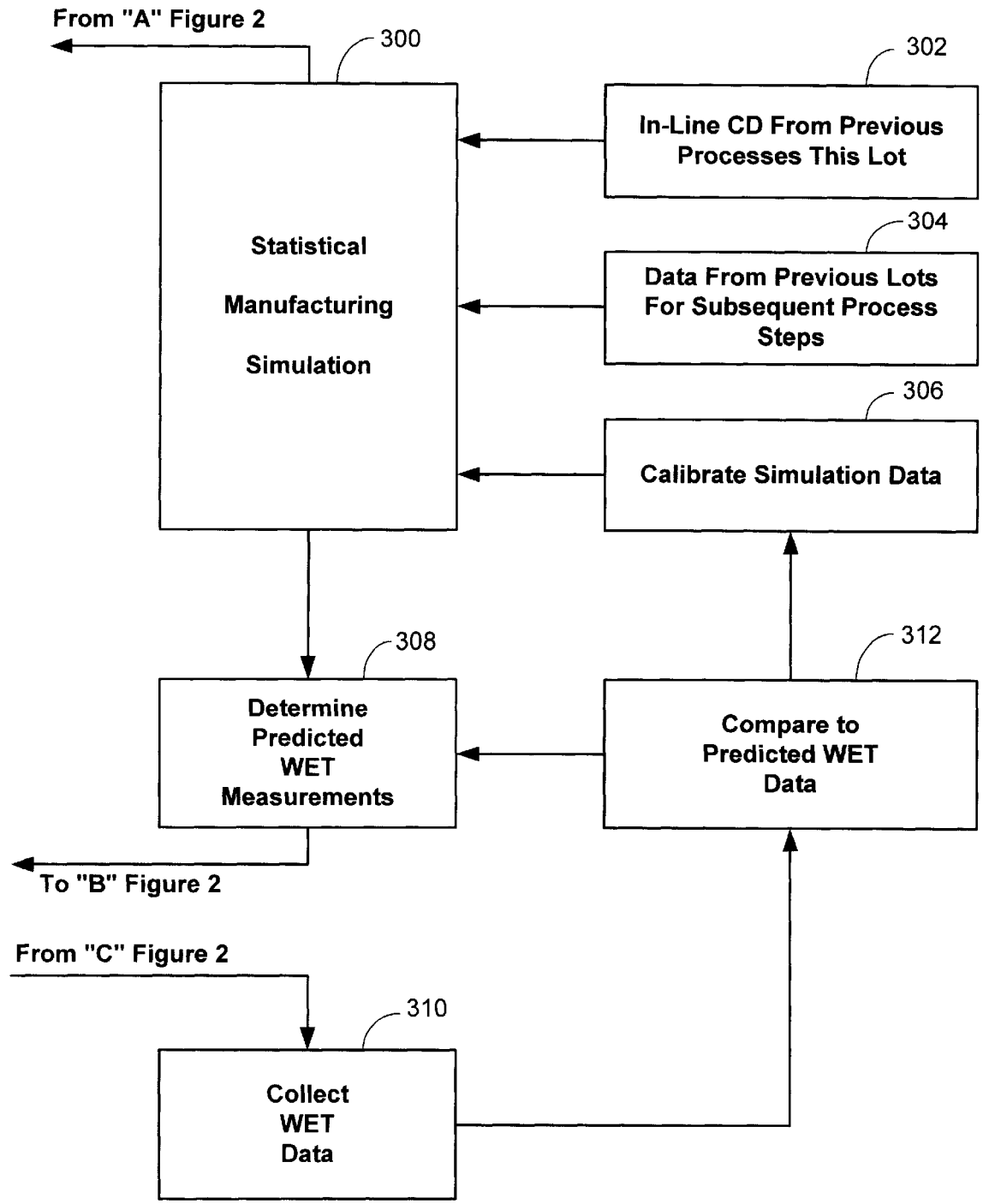

Referring to FIGS. 2–5, a wafer manufacturing process flow in accordance with the present invention is shown. In FIG. 2, the wafer lot is started in the manufacturing process, as indicated at 200. The process parameters for the first process are set on the process equipment as indicated at 202. The current process is run as indicated at 204. After the current process is run, the in-line critical dimensions are measured at 206. The in-line critical dimensions are input to a statistical manufacturing simulation at 300, FIG. 3. The statistical manufacturing simulation at 300 is conducted with data from in-line critical dimension measurements from previous processes from this lot as indicated at 302. The statistical manufacturing simulation at 300 is also conducted with data from previous lots for process steps after the current process step as indicated at 304. The statistical manufacturing simulation at 300 also includes calibration simulation data at 306. The calibration simulation data at 306 has input from a comparison made at 312 of the predicted WET measurements at 308 and the collected WET data from all previous process steps at 310. The statistical manufacturing simulation at 300 determines the predicted WET measurements at 308, which are input to the decision step at 208. The predicted WET measurements are also input to a database at 400, FIG. 4. The predicted WET measurements may provide a widened process control window. This means, for example, that a parameter that is currently being measured may be adjusted to compensate for a parameter that has been previously measured and was either within or without that parameters specification. The widened process control window provides more flexibility to the process control engineer to continue processing a wafer lot and can result in cost savings by not having to scrap wafer lots that can be saved by merely adjusting subsequent process parameters. If it is determined at 208 that the predicted WET measurements are not within the pre-established WET specifications, the wafer lot is scrapped if a remedy is not found, as indicated at 210. If it is determined at 208 that the predicted WET measurements are within the pre-established WET specifications, the predicted WET measurements are compared at 500 FIG. 5 with a table of WET specifications for the current layer shown at 502. If it is determined at 504 that the predicted WET parameters are not within the WET specifications for this layer tabulated in the table at 502 the wafer lot is scrapped or reprocessed as shown at 506. If it is determined at 504 that the predicted WET parameters are within the WET specifications for this layer tabulated in the table at 502, the circuit performance is simulated at 508 using the predicted WET parameters to obtain predicted device performance data as indicated at 510. Using the predicted device performance determined at 510 a disposition determination is made at 512 using disposition performance criteria tabulated at 514.

Referring again to FIG. 2, if the current process is determined at 212 as not being the last process, the wafer lot is sent to the next process as indicated at 214. If the current process is the last process, the WET measurements are conducted as indicated at 216. The results from the WET measurements are sent to a decision point at 218 and to a database 310 FIG. 3. The use of the WET database at 310 is discussed above. If the WET measurements are not within the WET manufacturing specification, the wafer lot is scrapped as indicated at 220. If the WET measurements are within the WET manufacturing specification, the wafer lot is sent to the next stage, as indicated at 222.

Figure 4:
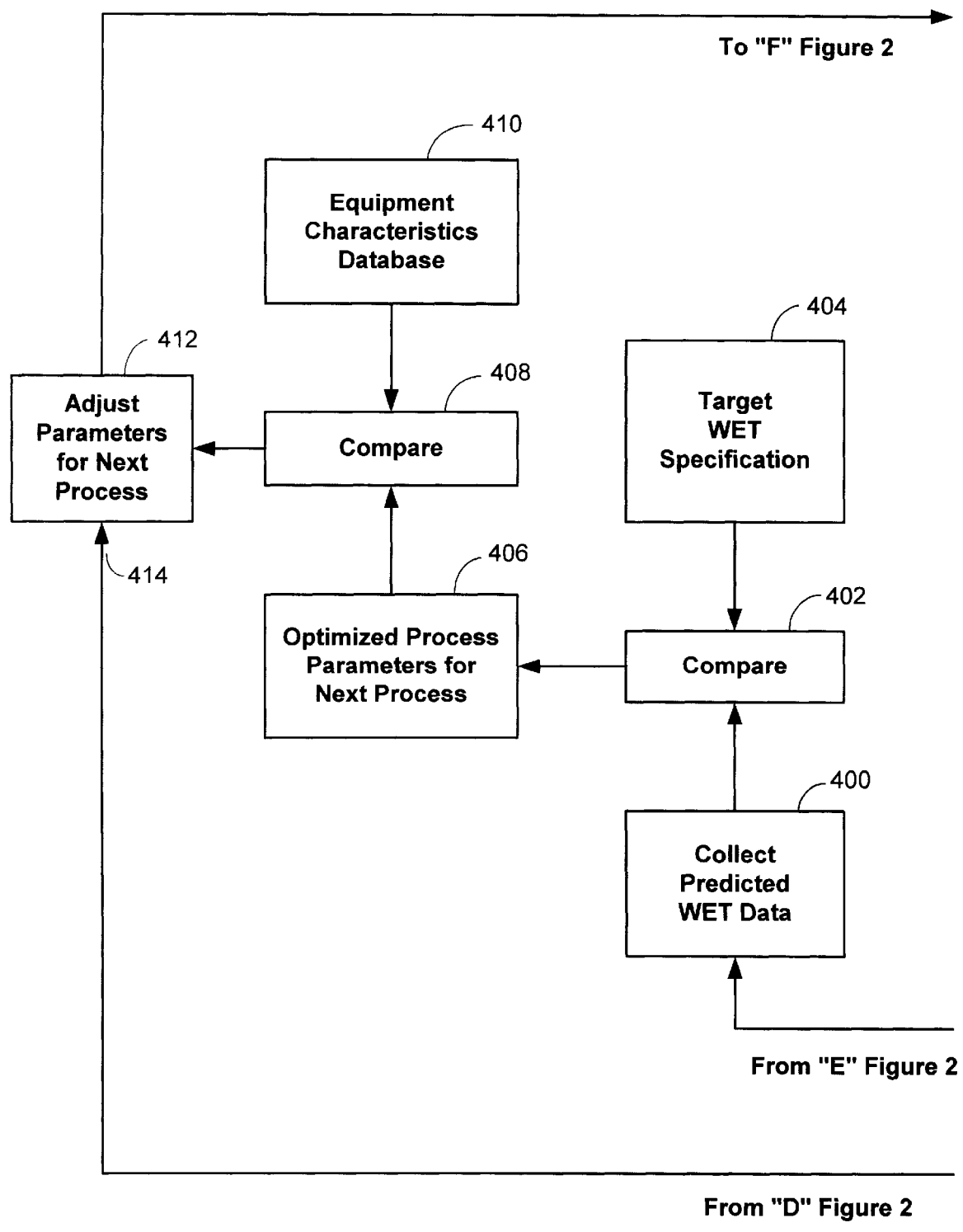
Figure 5:
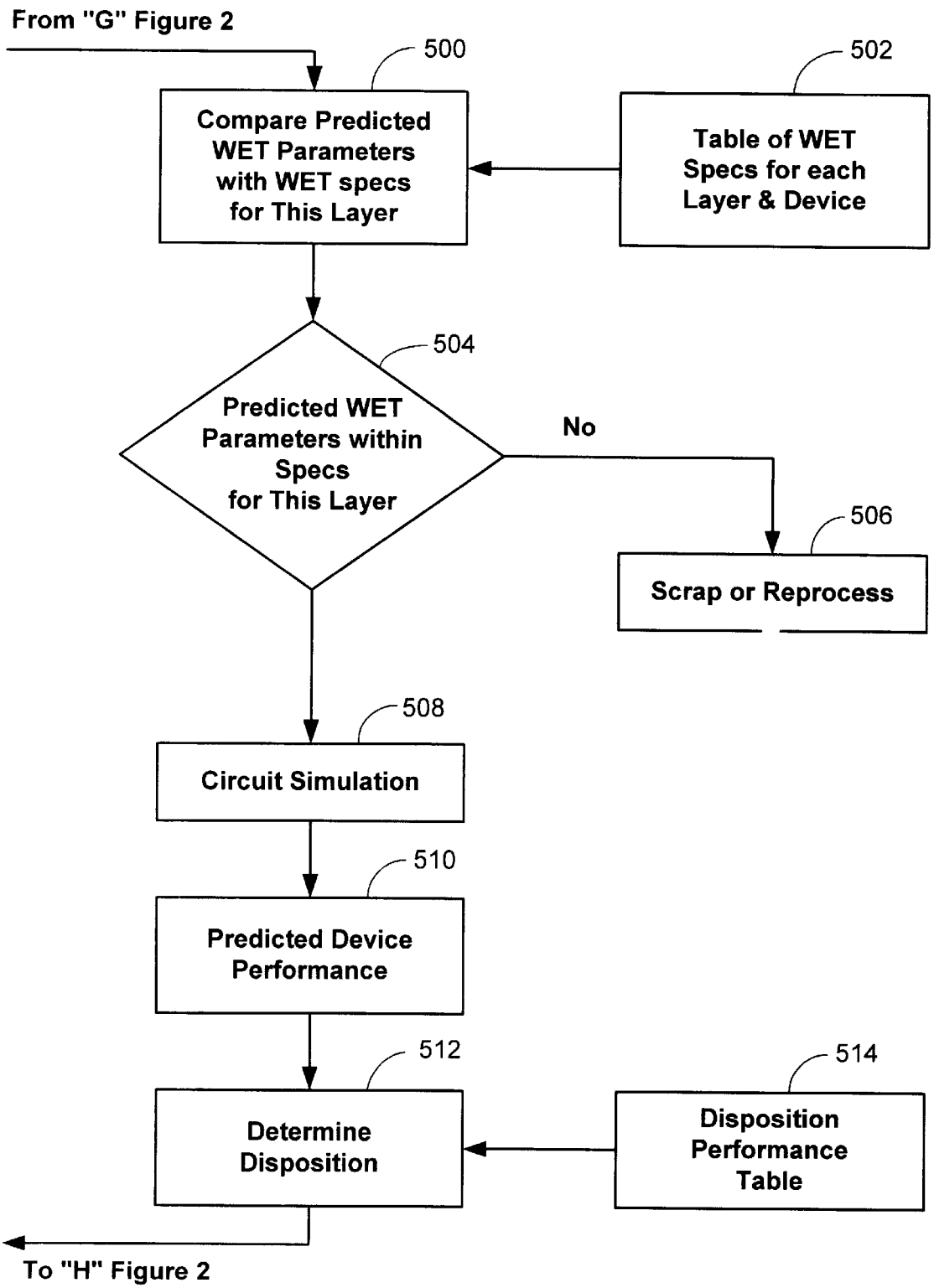

Referring to FIG. 4, the predicted WET data for the previous processes are collected at 400. The predicted WET data is compared at 402 with the target WET specification stored at 404. The comparison results in an optimized set of process parameters for the next process at 406. The optimized set of process parameters is compared at 408 with the next process equipment characteristics that are maintained in the equipment characteristics database at 410. The equipment characteristics database at 410 is updated as the equipment is used, measured and calibrated and contains the latest information available concerning the operating parameters of each piece of process equipment. The comparison at 408 is used to automatically adjust the set of parameters for the next process as shown at 412. The automatic adjust is triggered by the input 414 from the decision point 212 (FIG. 2). The set of adjusted parameters is input to the flow shown in FIG. 2 as indicated at 224 (FIG. 2) and the next process is run, as shown at 204.

The benefits of the present invention include the following:

1. It ensures that specific wafer lots achieve certain performance characteristics.

2. It maintains tight process control based on previous layer history and remaining absolute specification limit margins.

3. It provides critical information to the process engineering department for disposition decision purposes if specification targets are not met.

4. It allows for reduction in disposition time on hold thus reducing cycle time.

5. It enables the elimination of non-performing material at the point of misprocessing.

The foregoing description of the embodiments of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing semiconductor wafers, the method comprising:

starting a wafer lot in a process;

setting process parameters for the process and running the process;

measuring in-line critical dimensions after completion of the process and determining a set of predicted wafer electrical test parameters;

comparing the set of predicted wafer electrical test parameters with wafer electrical test specifications tabulated for the process;

determining whether the set of predicted wafer electrical test parameters are within the wafer electric test specifications tabulated for the process;

performing circuit simulations using the set of predicted wafer electrical test parameters;

predicting device performance based on the circuit simulations; and determining a disposition from the predicted device performance data.

2. The method of claim 1 wherein the step of determining a set of predicted wafer electrical test parameters comprises:

combining in-line critical dimensions from previous processes run on the wafer lot;

with data from previous lots for processes to be run subsequent to the process being run on the wafer lot; and calibration simulation data obtained from a comparison of the set of predicted wafer electrical test parameters and collected actual wafer electrical test measurements taken from previous wafer electrical test measurements.

* * * * *